United States Patent [19]

Dery et al.

[11] Patent Number: 4,588,456
[45] Date of Patent: May 13, 1986

[54] METHOD OF MAKING ADHESIVE ELECTRICAL INTERCONNECTING MEANS

[75] Inventors: Ronald A. Dery; Warren C. Jones, both of Winston-Salem, N.C.

[73] Assignee: AMP Incorporated, Harrisburg, Pa.

[21] Appl. No.: 657,717

[22] Filed: Oct. 4, 1984

[51] Int. Cl.[4] .......................................... H01B 13/06
[52] U.S. Cl. .................................... 156/52; 156/295; 174/88 R; 174/117 FF; 428/208; 428/397
[58] Field of Search ............... 156/52, 295; 174/71 R, 174/88 R, 117 FF, 117 A; 428/397, 208

[56] References Cited

U.S. PATENT DOCUMENTS

| | | | |
|---|---|---|---|
| 2,498,493 | 2/1950 | Hickernell | 174/126 C |
| 2,808,352 | 10/1957 | Coleman et al. | |
| 3,514,326 | 5/1970 | Stow | 264/104 X |
| 3,778,307 | 12/1973 | Stow | |
| 4,113,981 | 9/1978 | Fujita et al. | 252/511 X |
| 4,401,843 | 8/1983 | Harper et al. | 174/72 B |

FOREIGN PATENT DOCUMENTS 2831984 2/1979 Fed. Rep. of Germany .

OTHER PUBLICATIONS

"Packaging News", *Electronic Packaging & Production*, Apr. 1984.
"Tape Connectors?", *Circuits Manufacturing*, Mar. 1984, p. 24.
"Scotchlink Connector Tape" advertisement, *Electronic Products*, Aug. 15, 1984.

*Primary Examiner*—Robert A. Dawson
*Attorney, Agent, or Firm*—Katherine A. Nelson

[57] ABSTRACT

An adhesive interconnecting means is comprised of one or more conductors on an insulating substrate, a first adhesive layer, said first layer being anisotropically conductive and disposed over said conductors and substrate and a second adhesive layer said second layer being a flowable adhesive that extends over the first substrate and anisotropically conductive layer. The anisotropically conductive adhesive is comprised of a nonhomogenous mixture of conductive particles in a nonconductive adhesive binder; the conductive particles, of random size and shape, are dispersed randomly throughout the mixture in noncontiguous conductive units, each unit being comprised of one or more individual particles, the units being sufficiently spaced apart to preclude electrical conductivity between adjacent conductive areas on the same substrate. The flowable adhesive extends over the surface of the first substrate and conductive units to provide insulation whereby upon positioning the first substrate conductors in an overlapping conducting relationship to the second substrate conductors and applying pressure to the positioned areas, the adhesive flows from the positioned areas and exposes the conductive units thus bringing the exposed units into contact and electrical interconnection with the second substrate conductors accompanied by the adhesion of the remaining first substrate surface to the surface of the second substrate.

10 Claims, 12 Drawing Figures

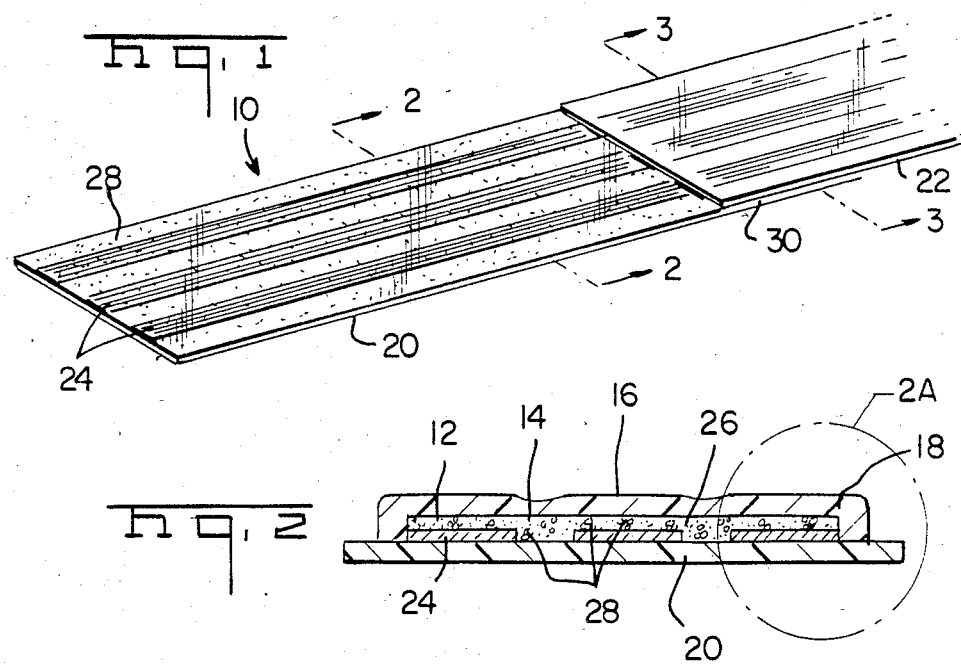
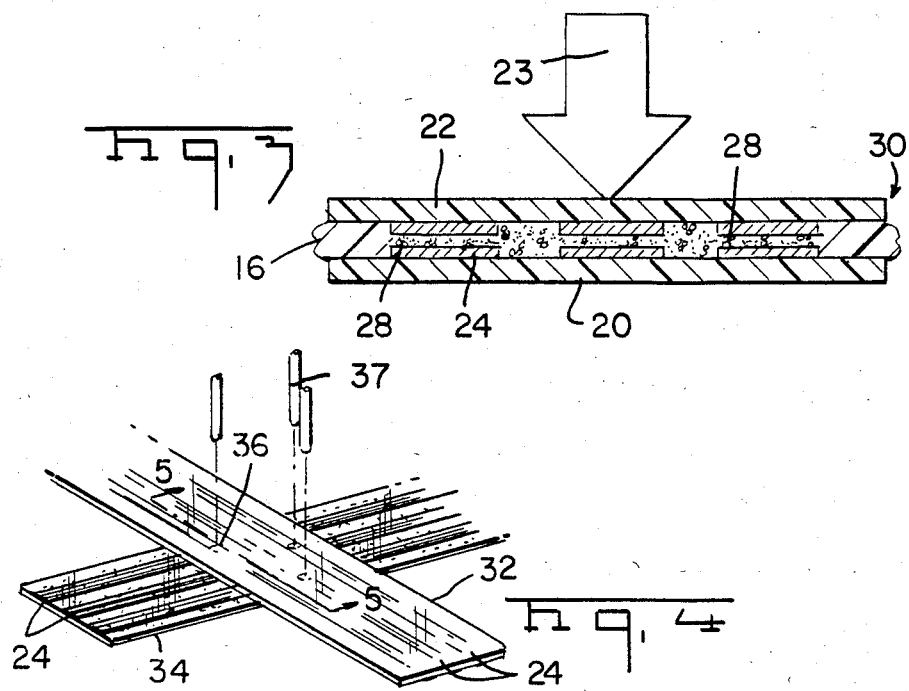

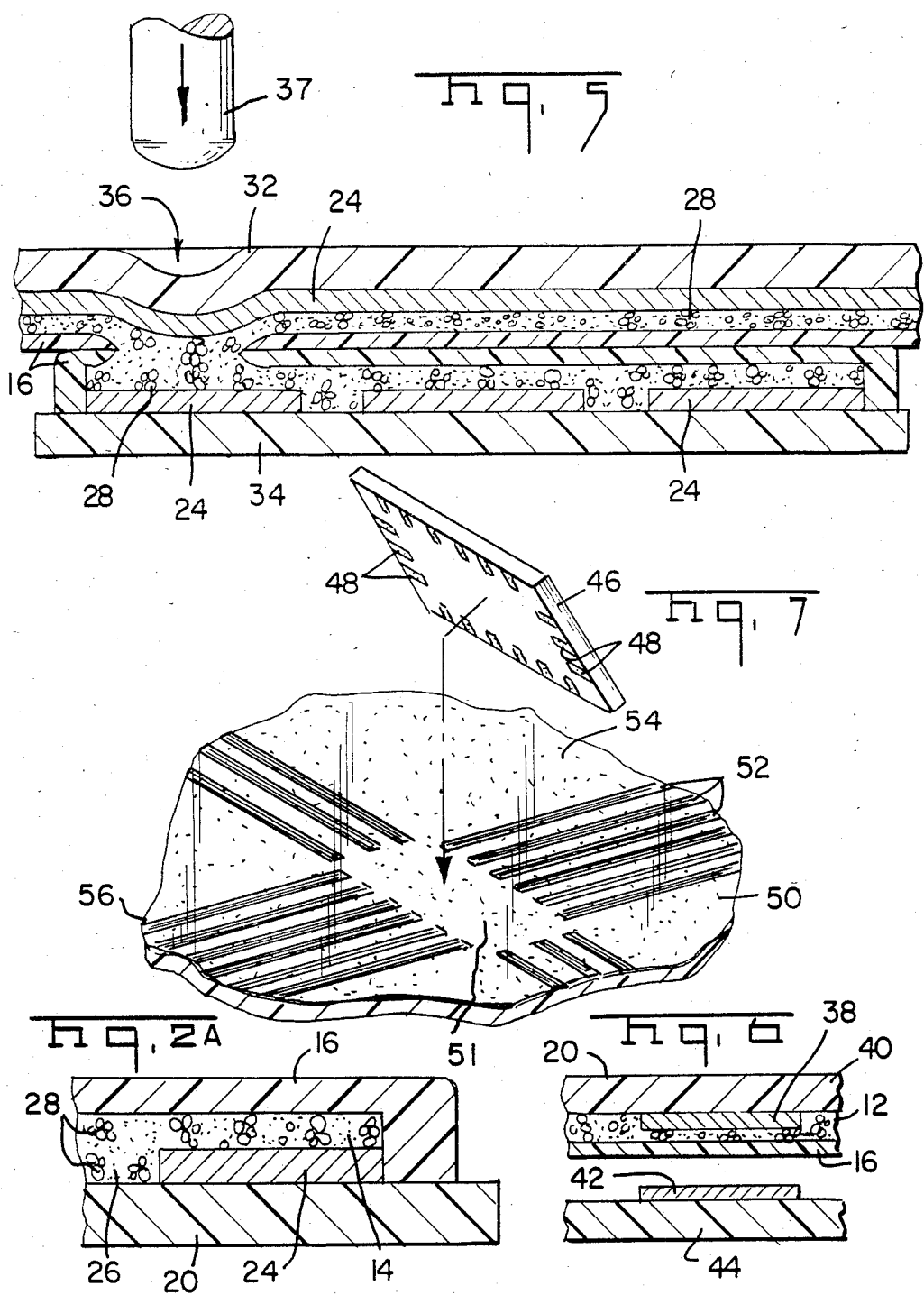

Fig. 10
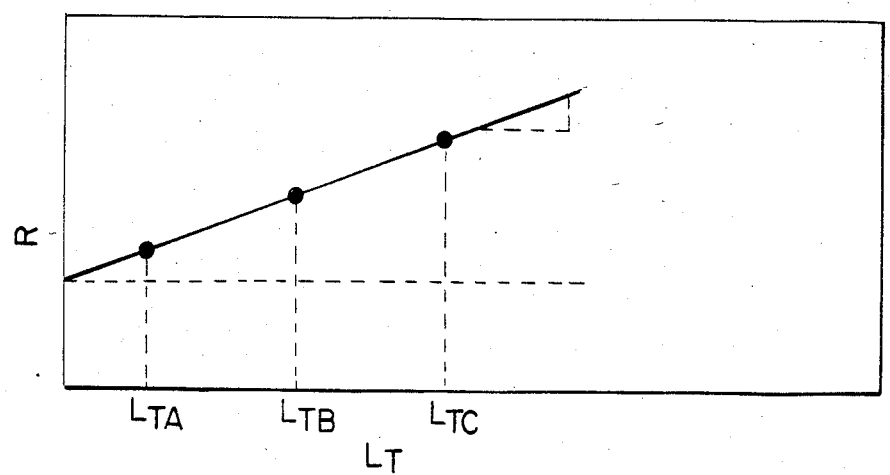
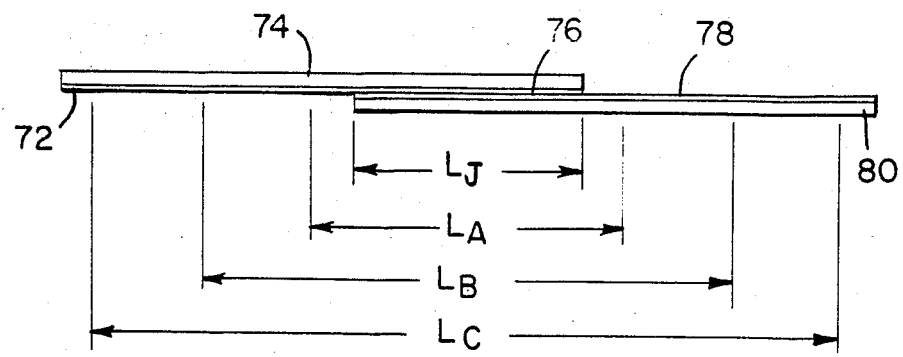
Fig. 11

METHOD OF MAKING ADHESIVE ELECTRICAL INTERCONNECTING MEANS

FIELD OF THE INVENTION

This invention is related to electrical connectors and in particular to adhesive based electrical interconnecting means.

BACKGROUND OF THE INVENTION

There is an ever-increasing need in the electronics industry for low profile and economical means for interconnecting electrical circuits. Traditionally, interconnecting means have required the use of housings, contact terminals, and in many cases, solder. Elastomeric connectors are also used, particularly for connecting components such as liquid crystal displays (LCDs). The present invention eliminates the need for housings, contact terminals and solder for many applications. The invention also eliminates the need for elastomeric connectors and their associated pressure sustaining assemblies.

A large number of printed circuit boards, membrane switches, and the like are used by the electronic industry.

The invention as disclosed herein provides a means for mechanically and electrically interconnecting conductive circuit traces or areas on one substrate with desired conductive circuit traces or areas on a second substrate. The circuitry may be placed on the substrates by a variety of techniques including etching and printing. The interconnecting means is made by applying a layer of an anisotropically conductive adhesive over the surface of the conductive traces or areas and the insulating substrate. The anisotropically conductive adhesive is comprised of a mixture of conductive particles in a nonconductive adhesive binder. Suitable anisotropically conductive adhesive compositions are disclosed in our copending U.S. patent application Ser. No. 601,836 filed Apr. 19, 1984 which is incorporated by reference herein. A layer of thermoplastic or heat activated insulating adhesive is then deposited over the surface of the anisotropically conductive adhesive and in particular to those areas which will be interconnected to conductive areas on another substrate. Interconnection is effected by positioning the desired areas in an overlapping conducting relationship such that the thermoplastic layer is disposed between the two conductive areas. Heat and pressure are applied to the aligned areas thus causing the thermoplastic layer to soften and flow from the aligned areas, and expose the conductive particles in the anisotropically conductive adhesive, thereby interconnecting said conductive areas. Concomitantly, the surrounding areas of substrate are bonded by the adhesive.

Use of the anisotropically conductive adhesive covered with the thermoplastic layer offers many advantages. The anisotropically conductive adhesive can be distributed over the entire surface of the substrate. The conductive particles are sufficiently separated from each other so that current will not flow between adjacent conductive areas on the same substrate. The anisotropically conductive adhesive and thermoplastic adhesive can be used on a variety of surfaces.

In one embodiment, the interconnection means is comprised of a continuous strip of flexible film having a plurality of parallel conductive traces deposited thereon, the surfaces of said traces being essentially covered by the anisotropically conductive adhesive and a layer of dielectric thermoplastic adhesive to form a flexible cable connector. The flexible cable connector can be cut to length and adhered to a second substrate anywhere along its length since the interconnecting capability is present at all points along the cable but is not activated until heat and pressure are applied.

The invention as disclosed herein is particularly useful for point-to-point matrix interconnections. Such interconnections can be made to any exposed conductive traces or areas or with other conductive areas having the anisotropically conductive adhesive and thermoplastic insulating layers in accordance with the invention.

Interconnecting means made in accordance with this invention offer connecting capabilities within the circuit path or area itself thus permitting direct connections between two surfaces without need for a housing. This is particularly advantageous when used on glass or other non-crimpable surfaces. Furthermore, these interconnecting means are particularly suitable for automatic assembly processes. In accordance with the invention these interconnecting means offer discrete and mass termination capabilities. If desired, the circuits can be terminated with standard connectors. Another means for interconnecting conductive circuit traces or areas on two substrates where at least one substrate has screened circuitry is disclosed in our copending U.S. patent application Electrical Interconnecting Means Ser. No. 657,851, filed Oct. 4, 1984.

The interconnecting means disclosed herein can also be used for surface mounting components to a substrate. The means is especially suitable for mechanically and electrically mounting leadless components to either flexible or firm substrates.

The interconnection means as disclosed herein can be understood by referring to the following drawings.

DESCRIPTION OF THE DRAWINGS

FIG. 1 is a perspective view of two sections of cable having the invention thereon and a lap joint between said two sections.

FIG. 2 is a cross-sectional view of the cable taken along the line 2—2 of FIG. 1.

FIG. 2A is an enlarged view of the encircled area of FIG. 2.

FIG. 3 is a cross-sectional view of the lap joint taken along the line 3—3 of FIG. 1.

FIG. 4 is a perspective view illustrating point-to-point matrix interconnections in accordance with the present invention.

FIG. 5 is a cross-sectional view of one matrix interconnection taken along the line 5—5 of FIG. 4.

FIG. 6 is a fragmentary cross-sectional view of the cable of FIG. 1 being interconnected to a circuit on a second substrate.

FIG. 7 is a fragmentary exploded perspective view illustrating surface mounting of a leadless component to a substrate by means of the invention.

FIG. 10 is a diagram of a graph plotting the total resistance through a length of lead-in conductive trace, a lap joint between two conductive traces joined by means of the invention disclosed therein, and a length of lead-out conductive trace versus the combined trace length between the two measuring points but not contained in the lap joint.

FIG. 11 is a diagrammatic view of the lap joint described in FIG. 10 illustrating how the measurements were taken.

DETAILED DESCRIPTION OF THE INVENTION

Figure 8:
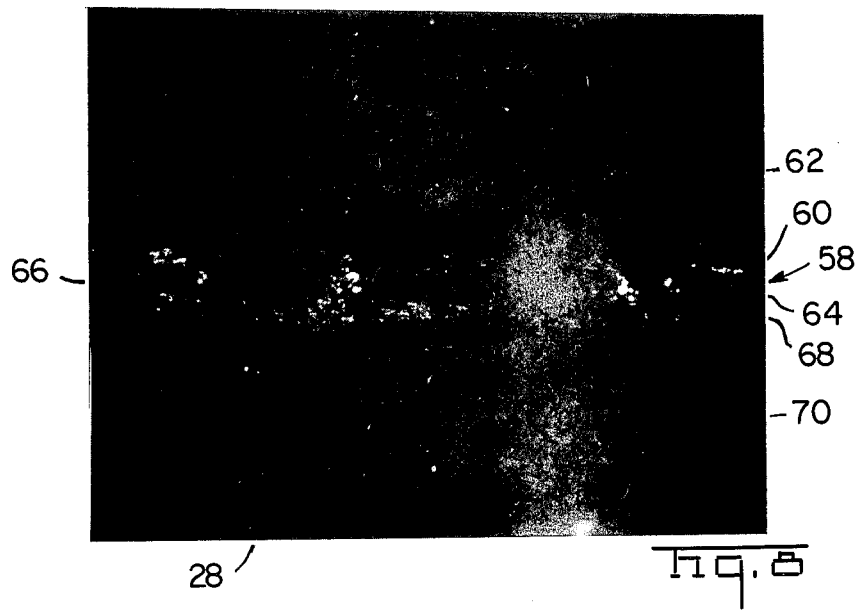
FIG. 8 is a micrograph of a cross-sectional view of a lap joint between a section of the cable of FIG. 1 and a section of cable without the anisotropic adhesive thereon. The surface is magnified 200 times using an optical microscope.

FIGS. 1 and 2 show an interconnecting means 10, comprised of a first layer 12 of anisotropically conductive adhesive 14 and a second layer 16 comprised of a thermoplastic insulating adhesive 18 deposited over substrates 20, 22 having plurality of conductive traces 24 thereon. The anisotropically conductive adhesive 14 is comprised of a nonconductive adhesive binder 26 and a plurality of conductive particles, the particles being dispersed as noncontiguous conductive particle units 28. As is further shown in FIGS. 2 and 2A, the conductive units 28 are dispersed randomly throughout the layer. By controlling the volume percent of the conductive units 28 conductivity between adjacent conductive traces is precluded. The conductive units 28 are not contiguous and, therefore, cannot conduct electricity from one adjacent area to another. There are, however, a sufficient number of conductive units 28 so that a plurality of the units 28 is deposited on the conductive traces 24.

A variety of conductive particles may be used. These particles may be made from a single metal, a base metal coated with a noble metal such as silver, gold, palladium, platinum or rhenium, a non-metallic particle coated with a noble metal, or a conductive non-metallic substance.

The size of the particles is important. The particles should not be so large that one of them will bridge the gap between adjacent conductive areas on the same substrate.

The particles, however, cannot be so fine that they will not disperse into noncontiguous conductive units. Fine particles such as those used for conductive ink formulations tended to form a thin continuous sheet layer and were not found suitable for anisotropically conductive adhesive compositions. Conductivity through the adhesive layer will not be achieved unless the conductive units approach the size of the depth of the adhesive layer. Depending upon the size of the particles used, the conductive unit may be a single particle or a plurality of clustered particles.

A variety of adhesive binders may be used such as pressure-sensitive adhesives, hot melt adhesives, and polymerizable adhesives. There are numerous adhesive binders available on the market. The anisotropically conductive adhesive composition is formulated by adding a volume percentage of conductive particles to the binder. For any given volume percentage, the size of the particles will determine the number of particles in that volume. The number of particles varies inversely with the size of the particles used.

As is shown in FIGS. 2 and 2A, the particles are contained within or partially within the anisotropically conductive adhesive. These figures further show a layer 16 of thermoplastic insulating material deposited over the traces 24 and surface of substrate 20.

A number of thermoplastic or heat activated adhesives are available from companies such as E. I. DuPont de Nemours and Co., Wilmington, Del. and Goodyear Tire and Rubber Co., Chemical Division, Akron, Ohio. The adhesives include but are not limited to those made from polyesters, polyamides, acrylics and polyolefins. Selection of the adhesive to be used depends primarily upon the temperature at which the adhesive softens and flows. This temperature must be sufficiently high so that the adhesive will not flow under ambient conditions but not be so high that the substrate or ink formulation will deteriorate when heat is applied. Pressure sensitive adhesives may also be used.

The thickness of the adhesive layer will be influenced to some extent by the size of the conductive particles in the anisotropically conductive adhesive layer. Generally the layer will be from 12.7 to 50.8 micrometers thick. The adhesive must be thick enough to cover all protruding particles thereby providing insulation for the conductors and substrate.

For example an interconnection means having typical polyester thermoplastic adhesive 25.4 micrometers thick requires a temperature of about 130°–150° C. and a pressure of 2.1 to 3.5 Kg/sq.cm. for approximately 10–40 seconds for the adhesive to flow and interconnection to occur.

FIGS. 1 and 3 illustrate a lap joint 30 formed between substrates 20 and 22. As is shown in FIG. 3, corresponding traces 24 on substrates 20 and 22 are positioned in an overlapping conducting relationship with the thermoplastic layer 16 dispoed between substrates 20 and 22. The interconnection is made by applying heat and pressure by conventional means 23 to substrates 20 and 22 thus causing the insulating thermoplastic layers 16 to soften and flow from between corresponding traces 24 enabling the conductive particles 28 in the anisotropically conductive adhesive covering said traces 24 to contact each other and the corresponding positioned trace thus effecting the electrical connection.

It is to be understood that the cable substrates illustrated in FIGS. 1 to 3 are representative substrates only. The invention disclosed herein can be used on flexible or rigid substrates or a combination thereof. Furthermore, the anisotropically conductive adhesive and thermoplastic insulating layer may be on one surface only.

FIGS. 4 and 5 illustrate point-to-point matrix interconnects 36 wherein traces 24 on a first substrate 32 are selectively interconnected with the desired trace 24 on a second substrate 34. This type of interconnection means is particularly useful where the substrates are flexible layers and there are a number of traces or conductive areas on at least two substrates that need to be selectively interconnected. Conventional heat and pressure means 37 are applied at the desired points to effect the interconnection. As is shown in FIG. 5, thermoplastic layer 16 softens and flows only from the preselected point where heat and pressure have been applied. The thermoplastic dielectric layer 16 remains between the substrates thus electrically insulating the remaining traces as they cross each other.

It is to be understood that the example used FIGS. 4 and 5 is representative only. The technique illustrated here can be used when both substrates are flexible or when one substrate is flexible and the other is rigid. Furthermore, the anisotropically conductive adhesive and thermoplastic insulating layers may be on one surface only. Point-to-point matrix interconnections permit a wide variety of interconnections between conductive areas on two or more substrates within a relatively short space.

FIG. 6 shows an alternative embodiment of the interconnecting means in which a conductive area 38 on substrate 40 having the anisotropically conductive adhesive and thermoplastic insulating adhesive layers 12, 16 thereon is interconnected with an exposed conductor 42 on a second substrate 44. Upon applying heat and pressure the thermoplastic layer 16, softens, flows and becomes thinner enabling the conductive units in layer 12 to extend through the thermoplastic adhesive layer 16 and make electrical connection with exposed conductor 42.

FIG. 7 illustrates a means for surface mounting a leadless electrical component 46 having conductive pads 48 thereon, to substrate 50 having conductive traces 52 thereon. Conductive traces 52 are covered by a layer 54 of anisotropically conductive adhesive and a layer 56 of thermoplastic insulating adhesive. The layers 54 and 56 can be applied over the mounting area 51 only or over the entire surface of substrate 50. Upon applying heat and pressure in the mounting area 51 the thermoplastic layer 56 softens, flows, becomes thinner and enables the conductive units in adhesive layer 54 to extend through layer 56 and make electrical connection with exposed contact pads 48. It is to be understood that the leadless electrical component is representative of the various components that can be surface mounted in accordance with the invention.

Figure 9:
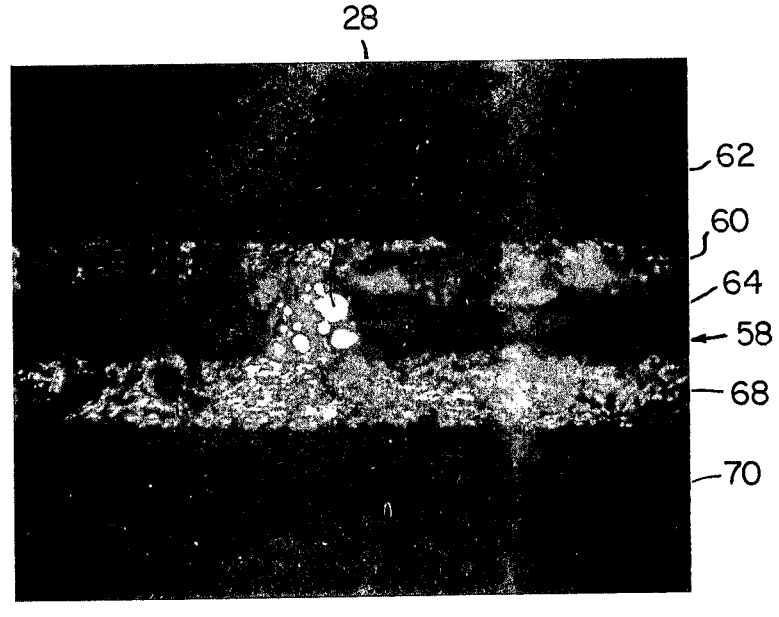
FIG. 9 is a micrograph of the section of FIG. 8 magnified 500 times.

FIGS. 8 and 9 are micrographs, magnified 200 and 500 times respectively, of a lap joint 58 formed by conductive trace 60 on substrate 62 having anisotropically conductive adhesive layer 64 and thermoplastic adhesive layer 66 thereon interconnected with conductive trace 68 on substrate 70. These figures show the cluster 28 of particles interconnecting traces 60 and 68.

The interconnecting means as disclosed herein, was tested by applying anisotropically conductive adhesive and thermoplastic insulating adhesive layers to lengths of flexible cable, said cable having a plurality of elongated conductors deposited thereon. Two sections of the cable were adhered to each other to form a 2.54 centimeter wide lap joint.

Measurements of joint resistance were made to compare the effectiveness of various compositions of the anisotropically conductive adhesive and thicknesses of thermoplastic insulating adhesives. Referring now to FIG. 10, the resistance of a length of trace 72 starting on one substrate 74, including the lap joint 76 and ending on the trace 78 the second substrate 80 was measured. Three such measurements were taken at different distances of separation $L_A$, $L_B$, and $L_C$. These resistance measurements were related to the trace length $L_T$ excluding the joint ($L_T$ equals the separation distance minus the joint length). Linear least squares analysis of the data allowed the values of joint resistance and resistance per unit length of trace to be derived. These relationships are illustrated in FIG. 11 and the following equations.

$$L_T = L_i - J_L$$

$$R = R_J + R_T L_T$$

$$R_J = R \text{ at } L_T = 0$$

$$R_T = \Delta R / \Delta L_T$$

where $L_T$ is trace length, i=A, B, or C, $J_L$ is joint length, R is resistance, $R_J$ is joint resistance, $R_T$ is trace resistance.

Joint efficiency was found to be a useful parameter for comparing joint performance. Joint efficiency is defined as the measured joint conductance (reciprocal of resistance) divided by the theoretical joint conductance (reciprocal of theoretical joint resistance). The theoretical lap joint resistance depends only on the resistance per unit length of the traces and the joint length. It is independent of the number of perfectly conducting bridging elements found in a lap joint.

The following examples illustrate the invention. They are not to be construed as limitations on the instant invention except as indicated in the appended claims. All compositions are expressed as percent by volume except where specifically indicated otherwise.

EXAMPLE 1

A polyester based conductive ink whose filler consisted of 95 percent by weight silver and 5 percent by weight carbon was used to screen five 1.27 mm wide traces on 2.54 mm center lines on 0.127 mm thick polyester film. After solvent evaporation the conductive traces were 20.3 micrometers thick. A hot-melt connecting trace sample was prepared by screen printing a layer of a solvated anisotropically conducting hot-melt adhesive over a 2.54 cm long section of the five conducting traces. A 20.3 micrometer thick layer of binder with protruding particles was produced after solvent evaporation. The solvated anisotropically conducting hot-melt adhesive was formulated by mixing 16.78 grams of silver coated (15 weight percent silver) nickel spheroidal particles obtained from Novamet, Inc., Wyckoff, NJ, as plated spheres with 100 grams of a polyester resin solution (35 percent solids). The resin solution contained 0.5 percent Modaflow flow modifier obtained from Monsanto Corporation, St. Louis, Mo. An additional layer of solvated polyester resin similar to that used for the anisotropically conducting hot-melt formulation but containing no particles was screen printed over the first layer. The thickness of both layers combined was 40.6 micrometers after solvent evaporation. A 2.54 cm long lap joint sample was prepared from 2.54 cm wide strips of the polyester film with the five screen printed conductive traces. One side of the joint employed a hot-melt connecting trace sample while the other side employed an uncoated trace sample. The uncoated sample was placed with the conductive traces facing the coating on the hot-melt connecting trace sample. Care was taken to align the two samples so that the conductive traces of the top sample were directly over those of the bottom sample. Heat at a temperature of 148.8° C. and a pressure of 3.52 Kg/sq. cm. were applied for a period of 20 seconds to bond the samples together. A control lap joint was prepared in a fashion similar to that described for the hot-melt connecting trace containing lap joint except that the hot-melt trace sample was replaced by a conductive trace sample coated with two successive layers of the unloaded polyester resin. The thickness of these two unloaded coatings combined was 40.6 micrometers after solvent evaporation. The conductive properties of the two joint specimens are compared in Table 1.

TABLE 1

LAP JOINT RESISTANCE PROPERTIES

| | Joint Efficiency[a] (percent) | Joint Resistance[b] (Milliohm) | Conductive Trace Resistance[c] (Milliohm/cm) |
|---|---|---|---|
| Hot Melt Connecting Trace[d] | 69 (8) | 830 (100) | 445 (12) |
| Control Trace[e] | 38 (12) | 1555 (173) | 457 (133) |

Notes for Table 1:
[a] Joint Efficiency = [(Joint Conductance)/(Theoretical Joint Conductance)] × 100 = (Trace Resistance/cm) × (Joint Length) × (0.5)/(Joint Resistance)
[b] Joint Resistance = Resistance through the 2.54 cm joint length region.
[c] Trace Resistance = Conductive silver ink trace resistance.
[d] Averages and the 95% confidence limits for the averages are shown for 5 traces.
[e] Averages and the 95% confidence limits for the averages are shown for 4 traces.

It is thought that the anisotropically conductive interconnection means of the present invention and many of its attendant advantages will be understood from the foregoing description. It will be apparent that various changes may be made in the form, construction and arrangement of the parts thereof without departing from the spirit or scope of the invention or sacrificing all its material advantages. The form herein described is merely a preferred or exemplary embodiment thereof.

What is claimed is:

1. A method of connecting at least one conductive path means of a first insulating member with at least one conductive means on a second insulating member comprising the steps of:
   selecting the first insulating member having at least one conductive path means on at least one surface thereof;
   applying a dielectric adhesive means covering said first insulating member and said conductive path means, said dielectric adhesive means having conductive particles of random size randomly dispersed throughout, said particles being spaced apart so that no electrical connection takes place on the surface of said insulating member;
   applying an insulating thermoplastic adhesive layer secured onto said first insulating member covering said at least one conductive path means;
   positioning said at least one conductive path means in a conducting relationship with said at least one conductive means on said second insulating member such that said thermoplastic adhesive layer is disposed between said at least one conductive path means and said at least one conductive means;
   applying heat and pressure to the positioned at least one conductive path and at least one conductive means causing said insulating thermoplastic adhesive layer to soften, flow and become thinner thus causing said large conductive particles on said at least one conductive path to extend through said insulating layer and make electrical connection with said at least one conductive means.

2. A method of connecting at least one conductive path means of a first insulating member with at least one conductive means on a second insulating member comprising the steps of:
   selecting the first insulating member having at least one conductive path means on at least one surface thereof;
   applying a dielectric adhesive means covering said first insulating member and said conductive path means, said dielectric adhesive means having conductive particles of random size randomly dispersed throughout, said particles being spaced apart so that no electrical connection takes place on the surface of said first insulating member;
   applying an insulating pressure sensitive adhesive layer secured onto said first insulating member covering said at least one conductive path means;
   positioning said at least one conductive path means in a conducting relationship with said at least one conductive means on said second insulating member such that said pressure sensitive adhesive layer is disposed between said at least one conductive path and said at least one conductive means;
   applying pressure to the positioned at least one conductive path and at least one conductive means causing said insulating pressure sensitive adhesive to flow and become thinner thus causing said large conductive particles on said at least one conductive path to extend through said insulating layer and make electrical connection with said at least one conductive means.

3. The method of connecting at least one conductive path of a first insulating member with at least one conductive means on a second insulating member as recited in claim 1 wherein said second insulating member is a leadless electrical component having at least one conductive pad thereon.

4. The method of connecting at least one conductive path of a first insulating member with at least one conductive means on a second insulating member as recited in claim 2 wherein said second insulating member is a leadless electrical component having at least one conductive pad thereon.

5. The method of connecting at least one conductive path of a first insulating member with at least one conductive means on a second insulating member as recited in claim 1 wherein said second insulating member is a leaded electrical component having at least one lead extending therefrom.

6. The method of connecting at least one conductive path of a first insulating member with at least one conductive means on a second insulating member as recited in claim 2 said second insulating member is a leaded electrical component having at least one lead extending therefrom.

7. The method of connecting at least one conductive path of a first insulating member with at least one conductive means on a second insulating member as recited in claim 1 wherein said second insulating member is a cable comprised of an insulating substrate having at least one elongated conductor on at least one surface thereof.

8. The method of connecting at least one conductive path of a first insulating member with at least one conductive means on a second insulating member as recited in claim 2 wherein said second insulating member is a cable comprised of an insulating substrate having at least one elongated conductor on at least one surface thereof.

9. The method of connecting at least one conductive path of a first insulating member with at least one conductive means on a second insulating member as recited in claim 1 wherein said first insulating member is a continuous flexible strip.

10. The method of connecting at least one conductive path of a first insulating member with at least one conductive means on a second insulating member as recited in claim 2 wherein said first insulating member is a continuous flexible strip.

* * * * *